United States Patent
Tsai et al.

(10) Patent No.: US 7,339,253 B2
(45) Date of Patent: Mar. 4, 2008

(54) RETROGRADE TRENCH ISOLATION STRUCTURES

(75) Inventors: Chao-Tzung Tsai, Hsinchu (TW);
Ling-Sung Wang, Hsin-chu (TW);
Ching Lang Yen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/919,546

(22) Filed: Aug. 16, 2004

(65) Prior Publication Data

US 2006/0033179 A1    Feb. 16, 2006

(51) Int. Cl.
*H01L 29/00* (2006.01)

(52) U.S. Cl. .................. 257/522; 257/510; 257/506; 257/501

(58) Field of Classification Search ............. 257/522, 257/506, 501, 510
See application file for complete search history.

(56) References Cited

U.S. PATENT DOCUMENTS

| | | | |
|---|---|---|---|
| 5,316,965 A | 5/1994 | Philipossian et al. | |
| 5,915,192 A | 6/1999 | Liaw et al. | |
| 5,950,093 A | 9/1999 | Wei | |
| 6,008,131 A | 12/1999 | Chen | |
| 6,069,058 A | 5/2000 | Hong | |
| 6,207,532 B1 | 3/2001 | Lin et al. | |
| 6,207,535 B1 | 3/2001 | Lee et al. | |
| 6,232,202 B1 | 5/2001 | Hong | |
| 6,238,996 B1 | 5/2001 | Liu et al. | |
| 6,251,735 B1 | 6/2001 | Lou | |
| 6,251,783 B1 | 6/2001 | Yew et al. | |
| 6,274,457 B1 | 8/2001 | Kakai et al. | |
| 6,287,938 B2 | 9/2001 | Lee et al. | |
| 6,313,007 B1 | 11/2001 | Ma et al. | |
| 6,329,261 B1 | 12/2001 | Kishimoto | |
| 6,331,469 B1 | 12/2001 | Park et al. | |
| 6,335,540 B1 | 1/2002 | Zhang | |
| 6,337,255 B1 | 1/2002 | Bradl et al. | |
| 6,342,428 B1 | 1/2002 | Zheng et al. | |
| 6,352,591 B1 | 3/2002 | Yieh et al. | |
| 6,358,818 B1 | 3/2002 | Wu | |
| 6,413,827 B2 | 7/2002 | Farrar | |
| 6,426,300 B2 | 7/2002 | Park et al. | |
| 6,472,301 B1 | 10/2002 | Lin et al. | |
| 6,500,727 B1 | 12/2002 | Chen et al. | |
| 6,512,283 B2 * | 1/2003 | Davies ........................ 257/522 |
| 6,514,805 B2 | 2/2003 | Xu et al. | |
| 6,537,888 B2 | 3/2003 | Lee | |
| 6,541,349 B2 | 4/2003 | Arthanari et al. | |
| 6,544,860 B1 | 4/2003 | Singh | |
| 6,544,861 B2 | 4/2003 | Joo | |
| 6,562,696 B1 | 5/2003 | Hsu et al. | |
| 6,573,143 B1 | 6/2003 | Li et al. | |
| 6,583,020 B2 | 6/2003 | Uhlig et al. | |

(Continued)

*Primary Examiner*—Samuel A. Gebremariam
(74) *Attorney, Agent, or Firm*—Duane Morris LLP

(57) ABSTRACT

Methods are provided for making retrograde trench isolation structures with improved electrical insulation properties. One method comprises the steps of: forming a retrograde trench in a silicon substrate, and forming a layer of silicon oxide on the walls of the trench by thermal oxidation, such that the trench is sealed and a space is formed within the layer of silicon oxide. The space can contain a vacuum or any of a variety of gases depending upon conditions of the thermal oxidation step. Retrograde trench isolation structures containing a space are also provided.

29 Claims, 15 Drawing Sheets

U.S. PATENT DOCUMENTS

| | | |
|---|---|---|
| 6,617,251 B1 | 9/2003 | Kamath et al. |
| 6,630,699 B1 | 10/2003 | Wylie |
| 6,635,945 B1 | 10/2003 | Ishitaka et al. |
| 6,649,996 B2 | 11/2003 | Miller et al. |
| 6,653,201 B2 | 11/2003 | Chung |
| 7,038,289 B2 * | 5/2006 | Marty et al. ................. 257/501 |
| 2004/0026761 A1 * | 2/2004 | Leonardi et al. ............ 257/506 |

* cited by examiner

RETROGRADE TRENCH ISOLATION STRUCTURES

FIELD OF THE INVENTION

This invention relates generally to the fabrication of shallow trench isolation structures in semiconductor devices, and more particularly to the fabrication of retrograde shallow trench isolation structures having improved electrical insulation properties.

BACKGROUND OF THE INVENTION

The fabrication of an integrated circuit normally begins by processing the semiconductor substrate to divide the surface area into regions where active devices and interconnects are to be formed, and other regions of dielectric which electrically isolate the active device regions. Shallow trench isolation (STI) structure is a common electrical isolation technique, especially for a semiconductor chip with high integration. The conventional STI process starts by forming a pad oxide layer and a nitride layer over a substrate surface. The pad oxide and nitride layer are patterned using conventional photolithographic techniques to form an opening over the area where the isolation structure is to be formed. Next, a relatively shallow trench is typically dry etched into a silicon (or other semiconductor) substrate. Dry etching may be performed by way of a plasma or reactive ion etch (RIE). Typically, in a plasma etching process, an etchant source gas is supplied to an etching chamber where the plasma is formed to generate ions from the etchant source gas. Ions are then accelerated towards the process wafer surface, by a bias voltage, where they impact and remove material (etch) from the wafer. Various gas chemistries are used to provide variable etching rates for etching different materials. Frequently used dry etchant source gases include fluoro-hydrocarbons to etch through a metal nitride layer, for example silicon nitride (SiN), and chlorine ($Cl_2$), and HBr to etch through a silicon layer to form the etched shallow trench isolation (STI) structure. Subsequently, the trench is filled with an insulator material such as silicon dioxide, for example, by a high density plasma chemical vapor deposition (HDP-CVD) or other process. Typically, the nitride and pad oxide layers are removed, for example by chemical mechanical polishing (CMP) or other techniques to complete the STI structure.

U.S. Pat. Nos. 5,731,241, and 6,562,696 describe additional issues associated with shallow trench isolation devices. One issue is related to the acid etch back process for removal of the nitride layer. Typically, acidic etching creates damage to the STI features, such as sharp corners, which can create localized high electrical fields, leading to shorts, yield losses and isolation reliability concerns.

U.S. Pat. Nos. 5,915,192 and 6,232,202 are incorporated by reference herein in their entireties, as though fully set forth herein. These patents describe the formation of retrograde STI structures using isotropic etching to produce a trench having a first portion, a second portion and walls, the second portion of the trench having a larger dimension than the first portion. These trenches are subsequently filled with dielectric material to provide isolation properties. The resultant retrograde STI structure increases the electrical insulation between the devices while maintaining the layout of the device on the substrate.

Based on market demands, there continues to be an increasing need for higher density devices. As spacing between circuit devices, such as transistors, on a given semiconductor substrate surface becomes increasingly smaller, the need for more effective isolation from defects, such as leakage currents, is required for reliability.

SUMMARY OF THE INVENTION

In some embodiments, a method of making an isolation structure, comprises the steps of: forming a retrograde trench in a silicon substrate, the trench having a first portion, a second portion and walls, the second portion of the trench having a larger dimension than the first portion; and forming a layer of silicon oxide on the walls of the trench by thermal oxidation; and sealing the trench so that a space is formed in the second portion.

In some embodiments, a method of making an isolation structure, comprises the steps of: forming a trench having walls and a bottom in a silicon substrate having oxide and mask layers thereon; forming a layer of silicon oxide on the walls and bottom of said trench by thermal oxidation; forming a self aligned trench opening through a portion of said silicon oxide layer and into the silicon substrate; isotropically etching the silicon substrate to produce a retrograde portion of the trench; forming an additional layer of silicon oxide by thermal oxidation; and sealing the trench so that a space is formed within the additional silicon oxide layer.

In some embodiments, a method of making an isolation structure, comprises the steps of: forming a first trench in a silicon substrate having a surface and oxide and mask layers; filling the first trench with a first dielectric material, and subsequently removing the oxide and mask layers to produce a substrate with a filled first trench; applying a second set of oxide and mask layers to the surface of the substrate and the first filled trench; masking a portion of the surface of the second mask layer such that a second trench can be formed within the first filled trench containing the first dielectric material; forming the second trench through a portion of the first dielectric material and into the substrate; isotropically etching an exposed portion of said silicon substrate to produce a retrograde portion of the second trench; forming a layer of silicon oxide by thermal oxidation; and sealing the second trench so that a space is created therein.

In some embodiments, a method of making an isolation structure comprises the steps of: forming a first trench in a silicon substrate having surface, oxide and first mask layers; filling the first trench with a first dielectric material; applying a second mask layer above the trench; removing at least a portion of the second mask layer such that spacers are formed over a portion of the surface of the first dielectric material; forming a second trench through the first dielectric material between the spacers; etching an exposed portion of the silicon substrate to produce a retrograde portion of the second trench; forming a layer of silicon oxide by thermal oxidation; and sealing the second trench so that a space is created therein.

In some embodiments, a trench structure comprises a semiconductor substrate having a trench therein, the trench having a first portion, a second portion and walls, the second portion having a larger dimension than the first portion, the trench having a layer of silicon oxide on the walls, wherein the layer of silicon oxide has sealed the trench, and a space has formed within the layer of silicon oxide.

In some embodiments a trench structure comprises a silicon substrate having a trench therein, the trench having a first portion, a second portion and walls, the second portion having a larger dimension than the first portion, the trench having a layer of silicon oxide on the walls, wherein said layer of silicon oxide has sealed the trench, a space has formed within the layer of silicon oxide, and wherein the silicon substrate further comprises a rounded top surface adjacent said trench.

DETAILED DESCRIPTION

Figure 1A:
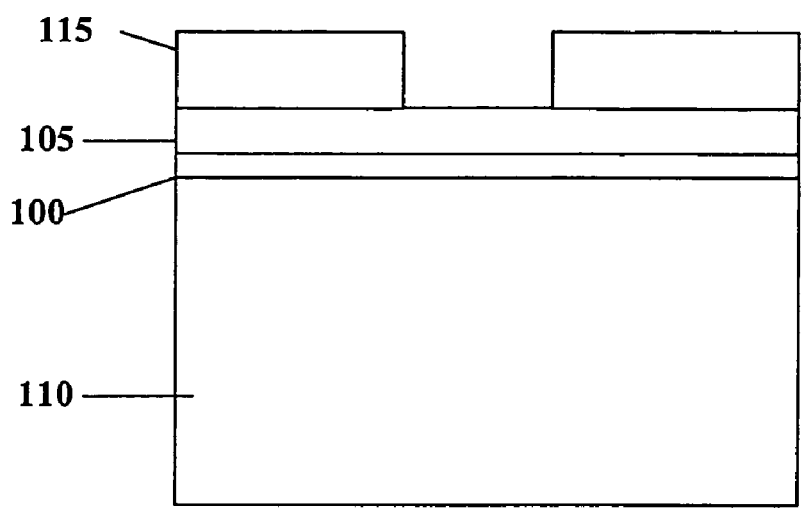
FIGS. 1A-1H show an exemplary method for forming an improved isolation trench structure according to one embodiment of the invention.

These and other features and advantages of the present invention will be more fully disclosed in, or rendered obvious by, the following detailed description of the preferred embodiment of the invention, which is to be considered together with the accompanying drawings wherein like numbers refer to like parts and further wherein the drawings are to be considered part of the entire written description of the invention. Terms used to describe the preferred structure and process embodiments have traditional meaning in the art. Relative terms such as "horizontal", vertical, "up", "down", "top", "bottom" should be construed to refer to the orientation as described or as shown in the drawing figure under discussion. The drawing figures are not necessarily to scale and certain features of the invention may be shown exaggerated in scale or in somewhat schematic form in the interest of clarity and conciseness.

Various embodiments are described below in which a thermal oxide is formed on the walls of a retrograde trench. The upper portion of the trench is sealed by oxide, so that a space is formed in the trench for improved isolation. The various embodiments make use of different process flows. For any given existing process flow, an embodiment can be selected that makes use of the existing process steps, and minimizes or eliminates the need to add further steps to the existing process in order to form a retrograde trench with a space therein.

FIGS. 1A-1H show an exemplary method for forming an improved isolation trench. The manufacturing process is described in conjunction with FIGS. 1A-1H. Referring to FIG. 1A, pad oxide layer 100 and silicon nitride layer 105 are sequentially deposited on a silicon substrate 110. The thickness of pad oxide layer 100 and silicon nitride layer 105 may be from about 30 to about 200 angstroms and from about 1500 to about 3000 angstroms, respectively. The pad oxide layer 100 is formed by thermal oxidation and the silicon nitride layer 105 may be formed by LPCVD (Low Pressure Chemical Vapor Deposition). On top of the silicon nitride 105 is a photoresist masking layer 115, having a pattern. This pattern can be defined using any photoresist coating, exposure and developing processes.

Figure 1B:
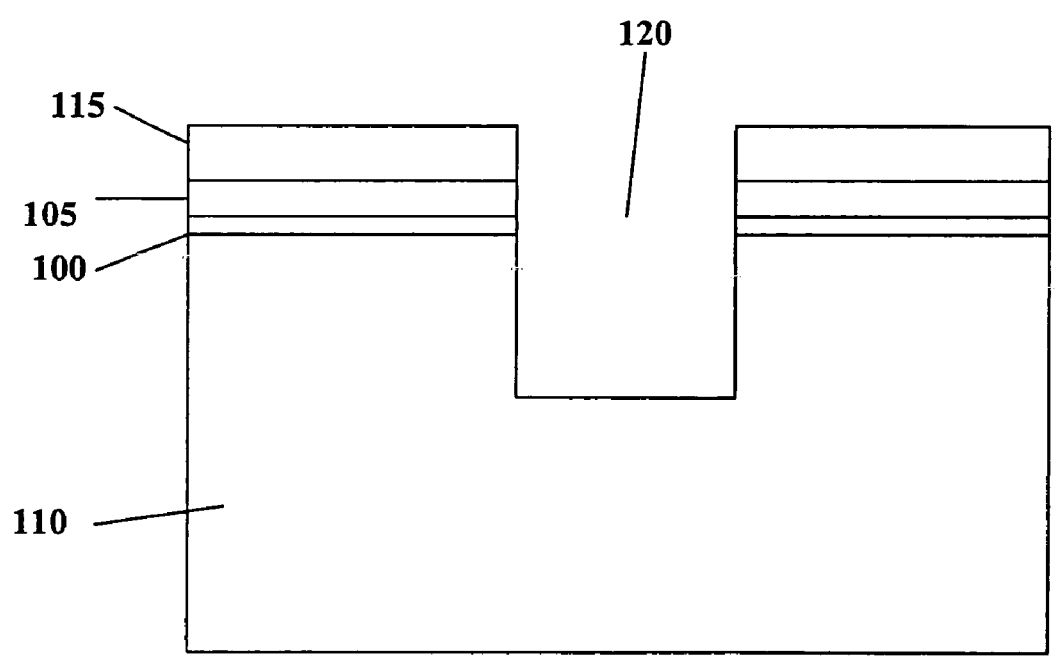

FIG. 1B shows the resulting structure after the silicon substrate 110, pad oxide layer 100 and silicon nitride layer 105 are etched to the depth of from about 2000 to about 5000 angstroms into the silicon substrate. Thus, a trench 120 of a depth from about 2000 to about 5000 angstroms is formed in the substrate 110. The method used to remove portions of pad oxide layer 100 and silicon nitride layer 105 is preferably wet etching, for example, using $CCl_2F_2$ solution as an etchant. The trench 120 may be formed by etching the substrate 110 using the gas mixture of $CClF_3$ and $Cl_2$ as an etchant.

Figure 1C:
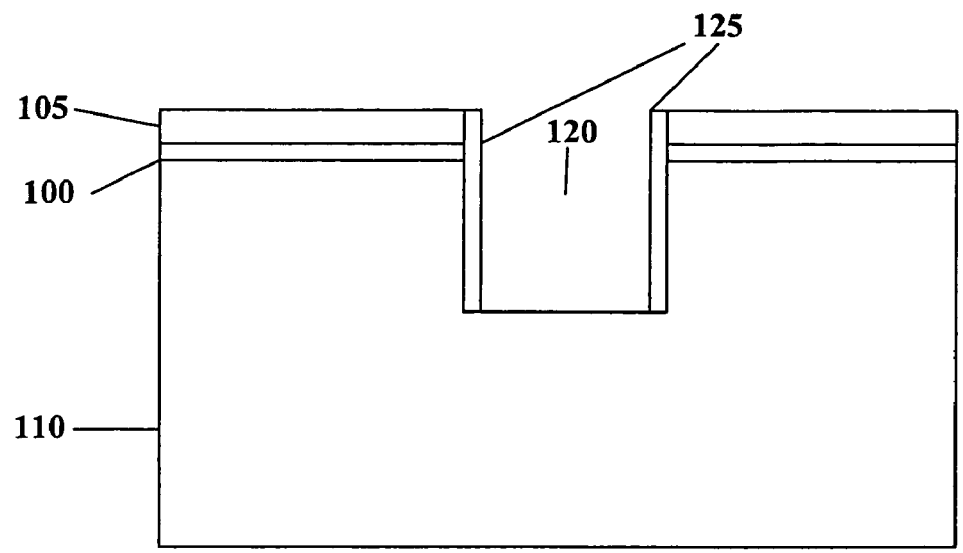

Next, in FIG. 1C, the photoresist layer 115 is removed and a silicon dioxide layer 125 is formed on the sidewalls of trench 120. The silicon dioxide layer 125 may be formed by thermal oxidation on the surface of trench 120. The thickness of the silicon dioxide layer 125 described above is about 110 to about 400 angstroms. FIG. 1C shows the resulting structure after the portion of silicon dioxide layer 125 described above at the bottom of trench 120 is removed. The anisotropic etchant used in this removal step may be, for example, $CHF_3$. Thus, the residual silicon dioxide layer 125 is formed on the surface of the sidewall of the trench 120.

Figure 1D:
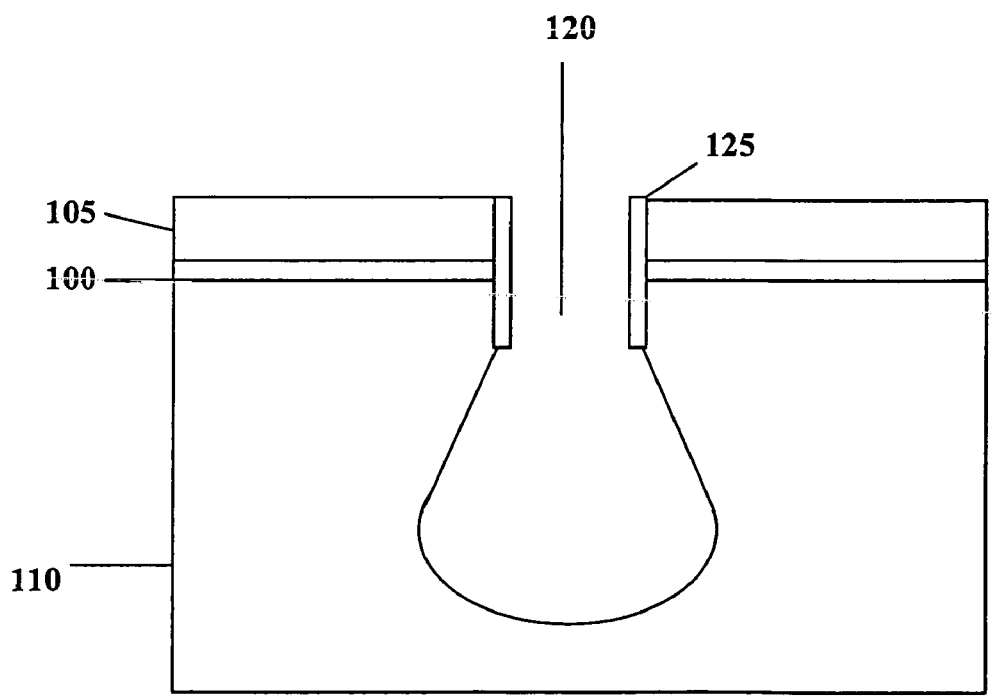

Using the residual silicon dioxide layer 125 as a mask, an etchant, such as $SF_6$, is used to isotropically etch the polysilicon at the bottom of the trench 120. FIG. 1D shows the resulting structure after the polysilicon at the bottom of the trench 120 is isotropically etched. The isotropic etching proceeds until approximately 1000 to about 3000 angstroms of the substrate 110 is removed.

Figure 1E:
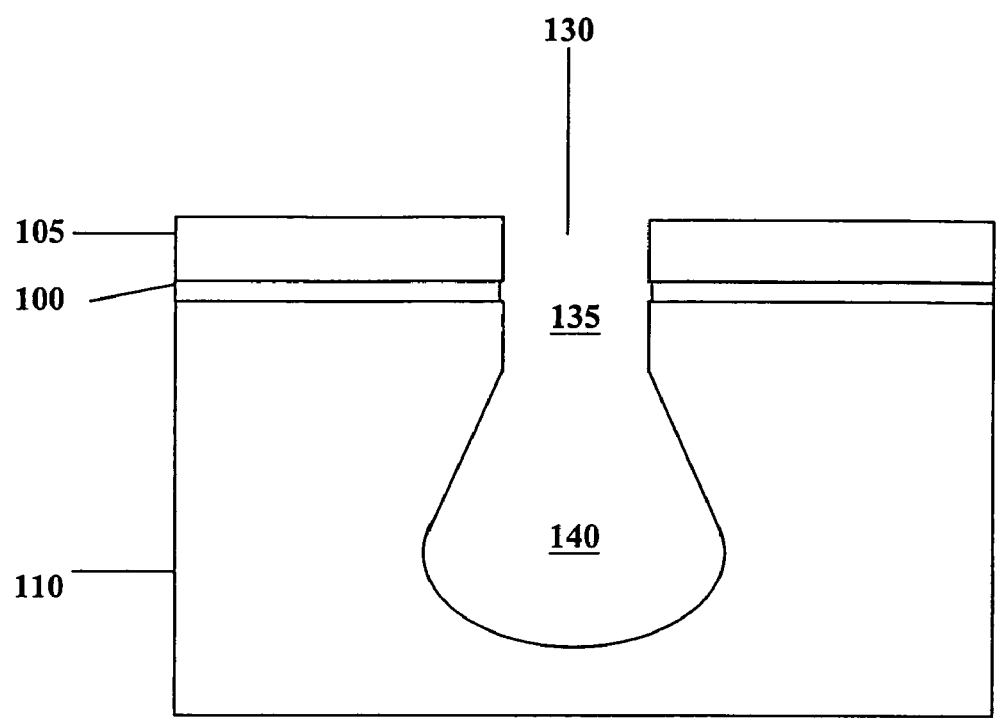

Referring to FIG. 1E, the residual silicon dioxide layer 125 is removed, producing a retrograde isolation trench 130 having a first portion 135, a second portion 140 and walls, wherein the second portion 140 of the trench has a larger dimension than the first portion 135. To remove the residual silicon dioxide layer 125 shown in FIG. 1D, an etchant, such as a solution of $CF_4$ is used in the wet etching.

Figure 1F:
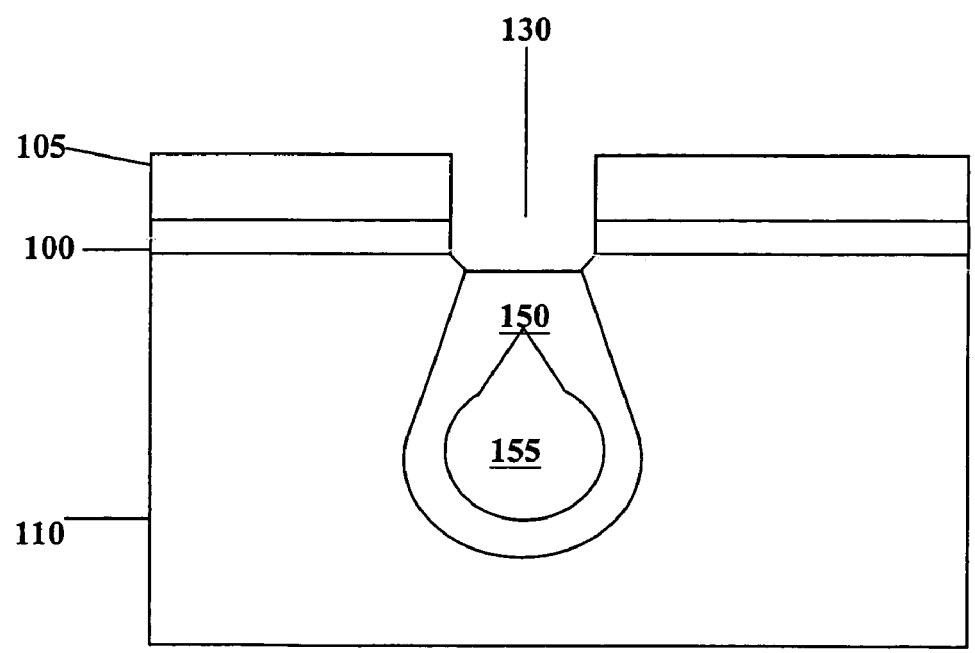

FIG. 1F shows the resulting retrograde trench structure after a silicon dioxide layer 150 is grown by thermal oxidation, resulting in sealing the trench 130 and creation of a space 155 within the silicon oxide layer 150.

Figure 1G:
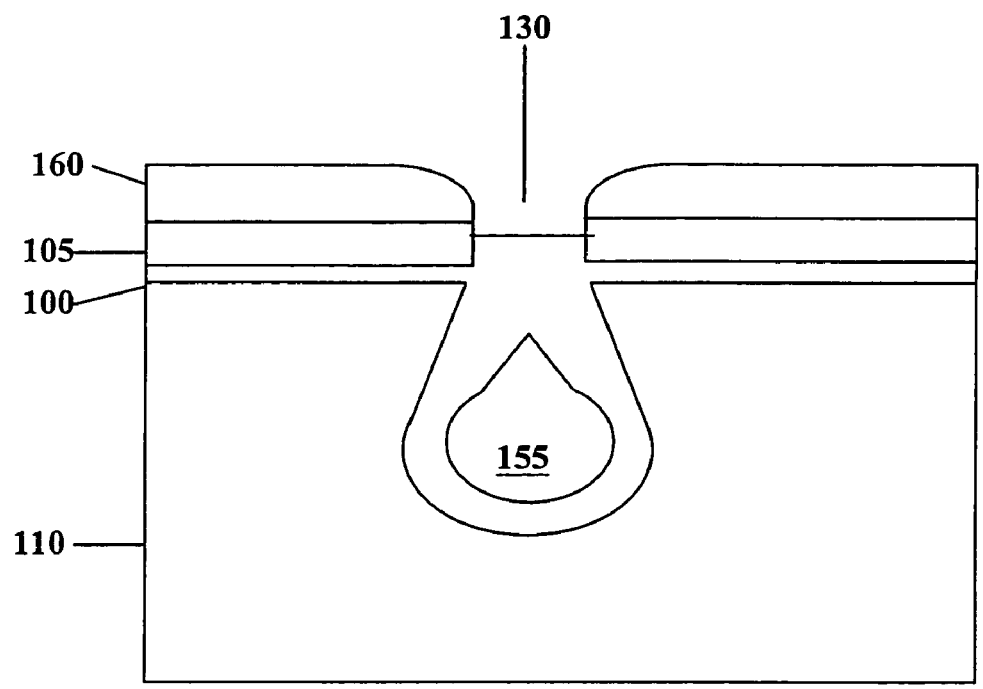

FIG. 1G shows additional silicon oxide deposition over the entire substrate to further fill the retrograde isolation trench 130 including the space 155.

Figure 1H:
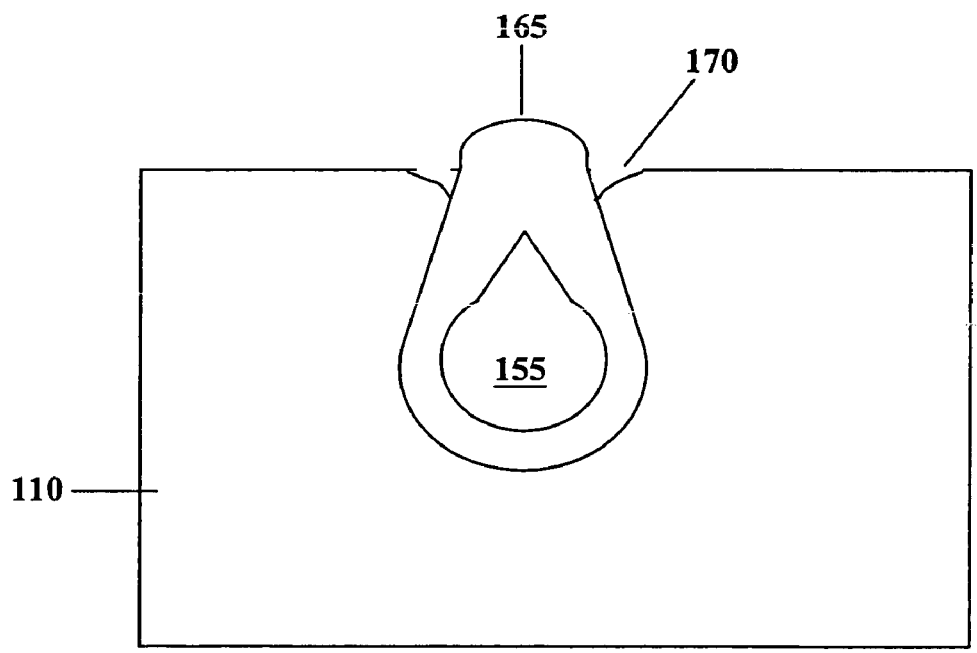

FIG. 1H shows the final filled retrograde isolation trench structure 165 including the space 155 after masking materials are removed. The final structure comprises a silicon substrate 110 having a trench structure 165 with a space, and a rounded top surface 170 adjacent the trench. This rounding occurs due to oxidation of the silicon substrate under the edges of the masking layers 100 and 105 during the thermal oxidation silicon oxide step of sealing the trench 130. The oxidized edge portion of the substrate 110 under the mask is removed when the masking materials are removed. This results in the substrate 110 having a surface 170 which is rounded adjacent to the filled trench structure 165. Thus, a single oxidation step can simultaneously perform two functions: sealing the retrograde trench to form a space therein, and rounding the top corners of trench.

Figure 2A:
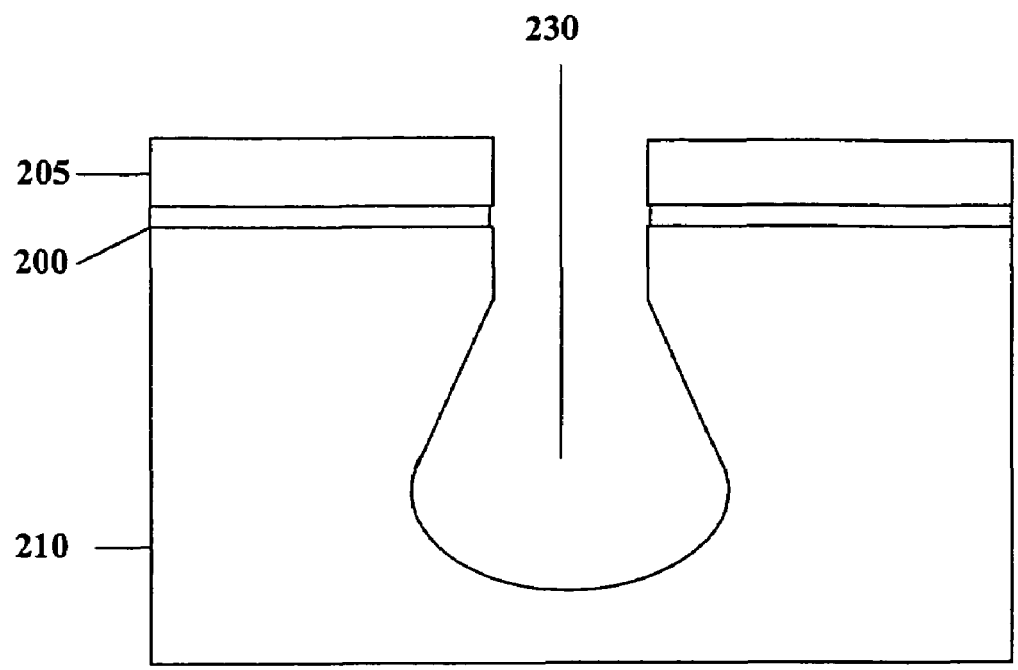
FIGS. 2A-2C show a variation of the method of FIGS. 1A-1H.
Figure 2B:
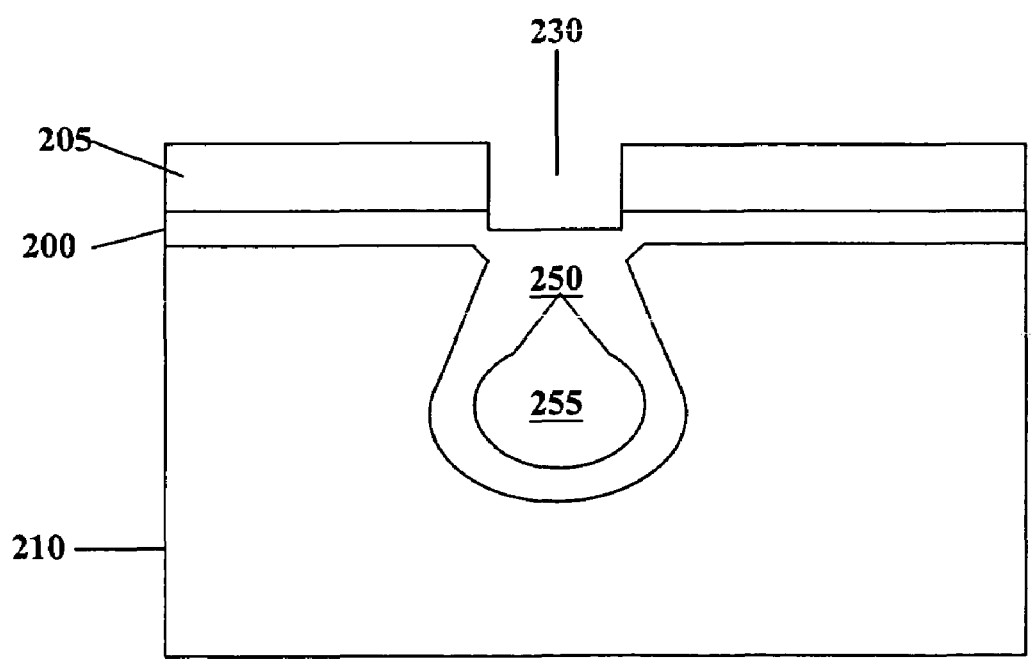
Figure 2C:
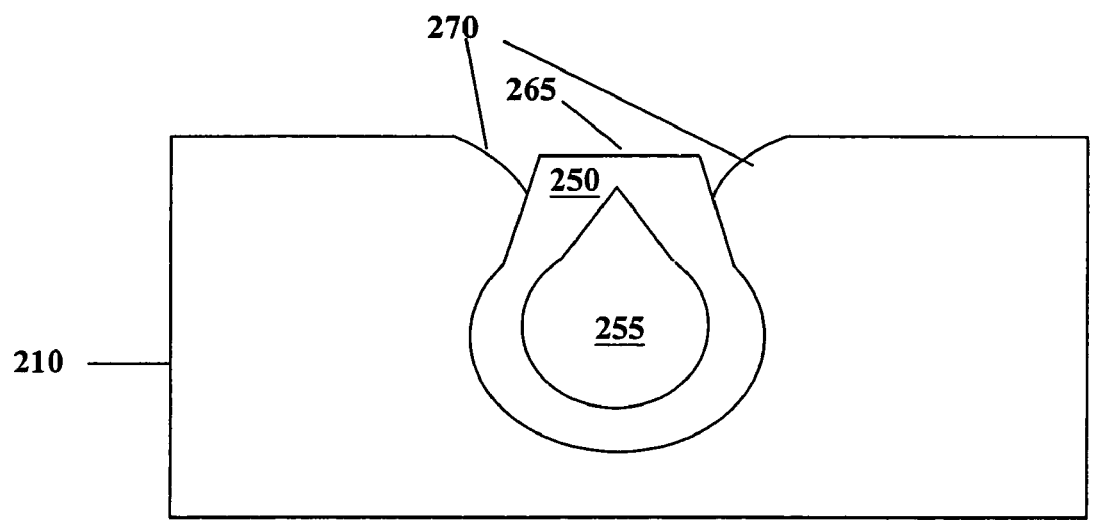

FIGS. 2A-2C show another exemplary embodiment. Items in FIGS. 2A-2C that are the same as items in FIGS. 1A-1H are indicated by reference numerals that are increased by 100. These include the pad oxide layer 200, the silicon nitride layer 205, the silicon substrate 210, the retrograde trench 230, the layer of silicon oxide 250 grown by thermal oxidation, and the space 255 created within the silicon oxide layer 250. A description of these items is not repeated.

FIG. 2A is the same trench as shown in FIG. 1E, and may be formed by the same steps described above.

FIG. 2B is similar to FIG. 1F and shows the resulting structure after silicon oxide layer 250 is grown by thermal oxidation. This results in the silicon oxide layer 250 sealing the trench 245 and creating a space 255 within the silicon oxide layer 250. However, in FIG. 2B, the thermal oxidation step is continued until the surface of the silicon oxide layer 250 grown by thermal oxidation is above the surface of substrate 210. An additional SiO deposition step (such as is shown in FIG. 1G) is not required. Nor is a planarization step required. Thermal oxidation alone provides sufficient oxide material to seal and fill the trench 265.

FIG. 2C shows the final filled retrograde isolation trench structure 265 including the space 255 after masking materials are removed. The final structure comprises a silicon substrate 210 having a trench structure 265 with a space 255 and a rounded top surface 270 adjacent the trench. This rounding occurs due to oxidation of the silicon substrate under the edges of the masking layers during the thermal oxidation process of sealing the trench with silicon oxide.

FIGS. 3A-3G show another exemplary embodiment. Items in FIGS. 3A-3G that are the same as items in FIGS. 1A-1H are indicated by reference numerals that are increased by 200. These include pad oxide layer 300, silicon nitride layer 305, silicon substrate 310, photo resist 315, and trench 320. A description of these items is not repeated.

Figure 3A:
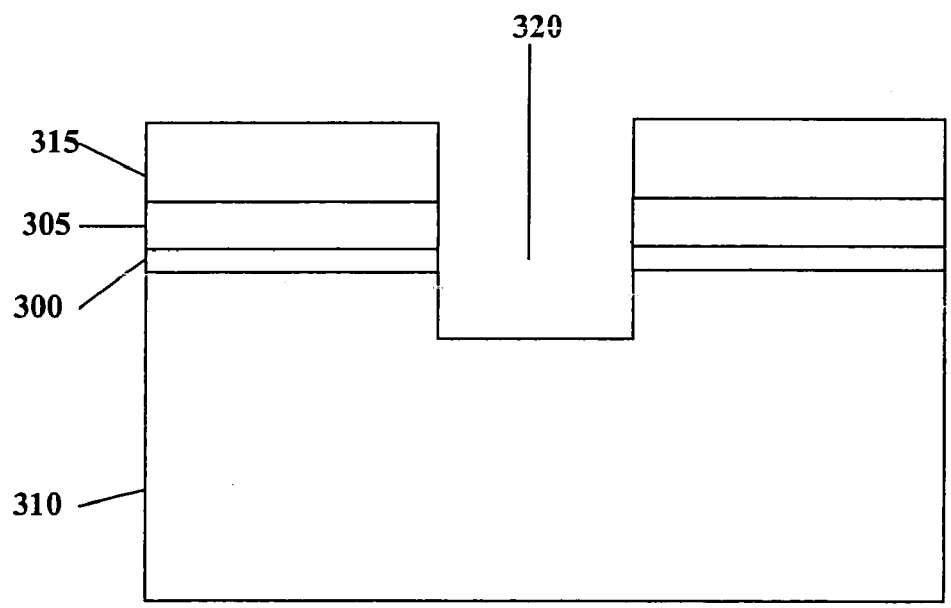
FIGS. 3A-3G show another exemplary method for forming an improved isolation trench according to another embodiment of the invention.

FIG. 3A shows the formation of a trench 320 as in FIG. 1B.

Figure 3B:
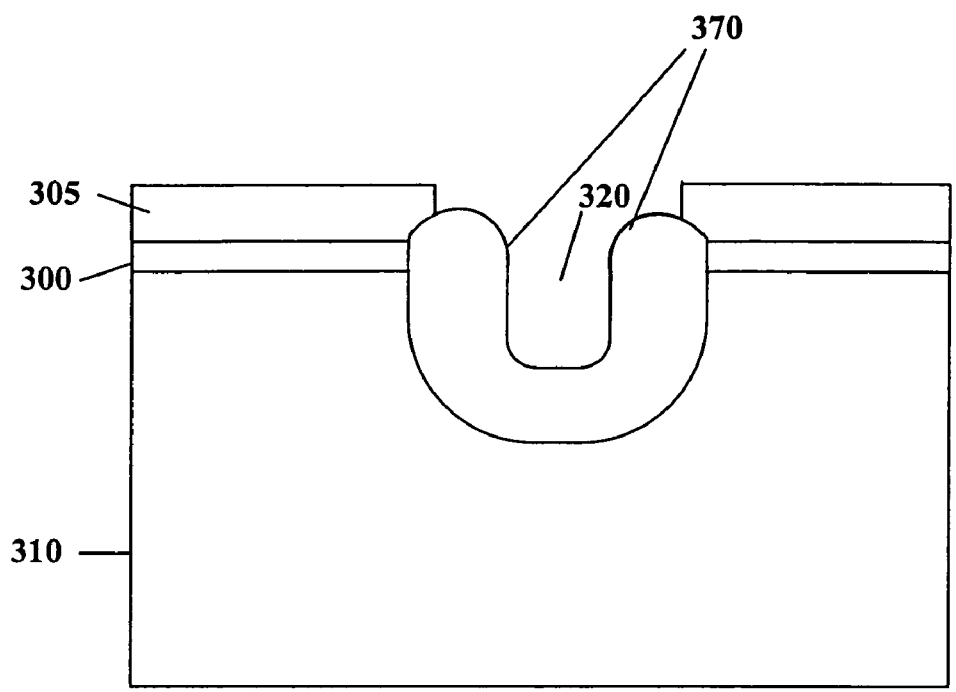

FIG. 3B shows trench 320 comprising a layer of silicon oxide 370 grown by thermal oxidation. FIG. 3B shows the trench after the subsequent removal of photo resist 315.

Figure 3C:
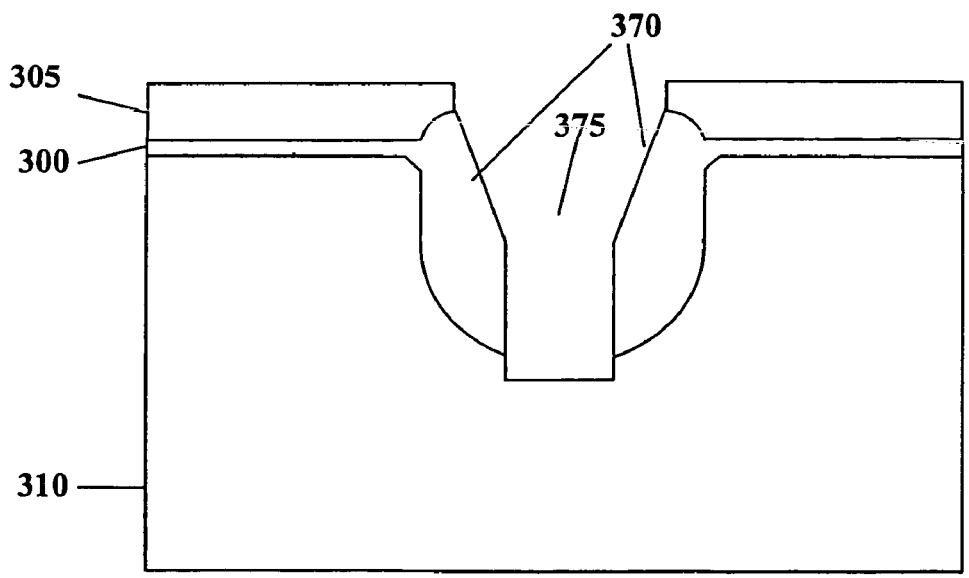

FIG. 3C shows formation of a self aligned trench 375 through the silicon oxide layer 370 and into the silicon substrate 310. This may be done, for example, by using well known techniques, such as an anisotropic dry etching step.

Figure 3D:
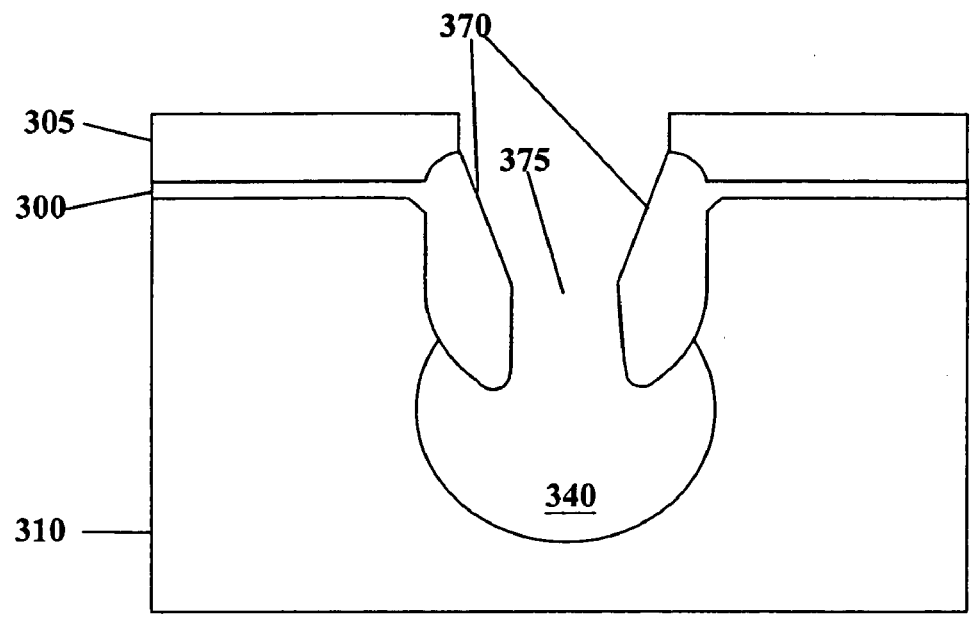
Figure 3E:
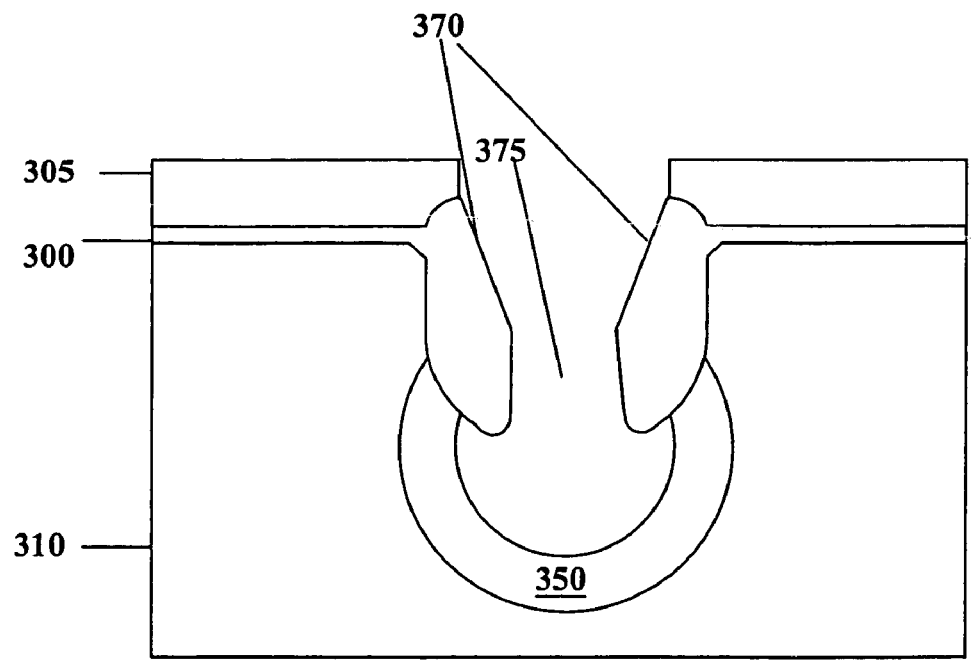

FIG. 3D shows formation of a retrograde trench structure 375 after isotropic etching. FIG. 3E shows formation of silicon oxide by thermal oxidation growth onto the walls of the retrograde trench 330. This isotropic etch step uses a selective etchant to etch the silicon substrate 310, but not the oxide layer 300. At this stage, the thickness of the oxide in the upper portion of the trench is less than half of the trench dimension, so the trench is not yet completely sealed.

Figure 3F:
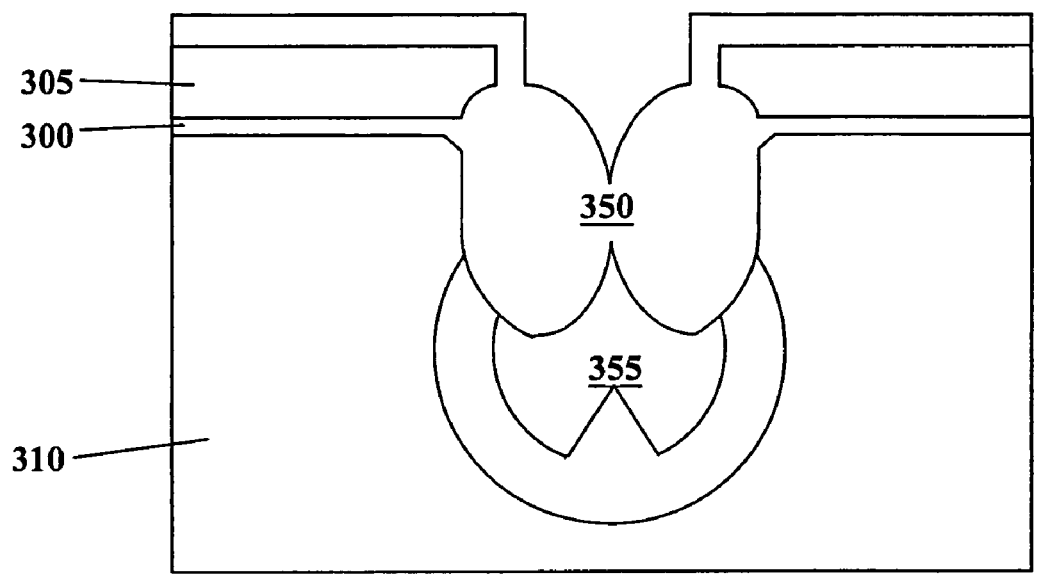

FIG. 3F shows the result of an oxide deposition step. The oxide material is deposited using an isotropic process, thereby sealing the trench 375 and creating a space 355 within the silicon oxide layer 350. FIG. 3F shows formation of additional silicon oxide over the sealed trench as described in FIG. 1G.

Figure 3G:
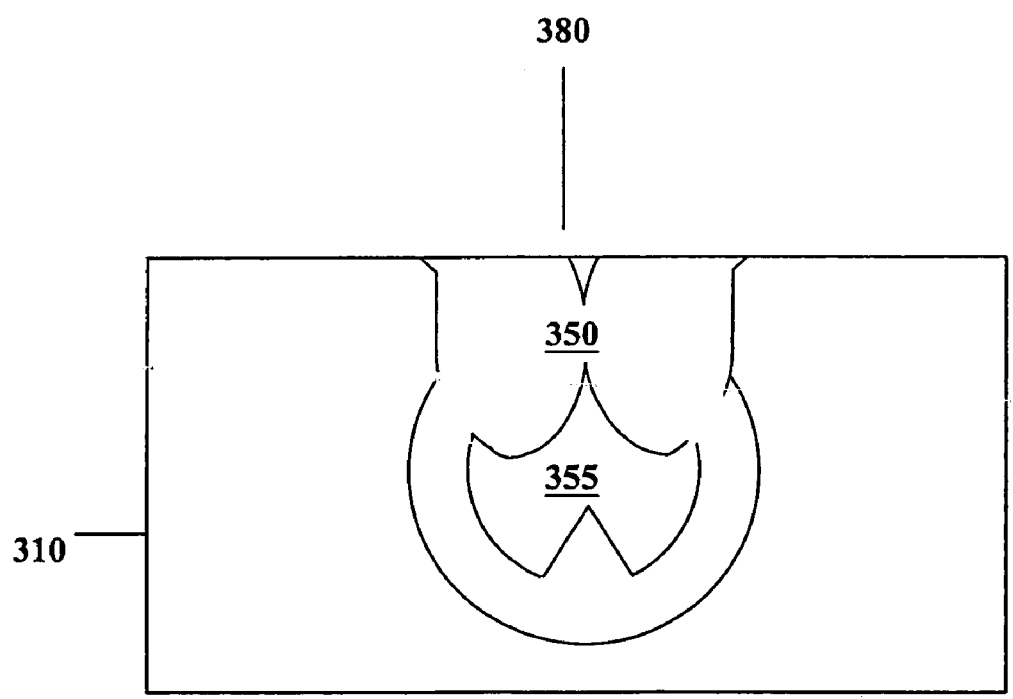

FIG. 3G shows the removal of the mask layers, which may be done by CMP techniques, for example, to form the retrograde isolation trench structure 365 comprising a silicon oxide layer 350 with a space 355 therein.

FIGS. 4A-4E show another exemplary embodiment. Items in FIGS. 4A-4E that are the same as items in FIGS. 1A-1H are indicated by reference numerals that are increased by 300. These include pad oxide layer 400, silicon nitride layer 405, silicon substrate 410, photo resist 415, trench 420, and retrograde trench 430. FIB 4A shows a traditional isolation trench 490 in a silicon substrate 410 filled with dielectric material, such as silicon oxide. A description of these items is not repeated.

Figure 4A:
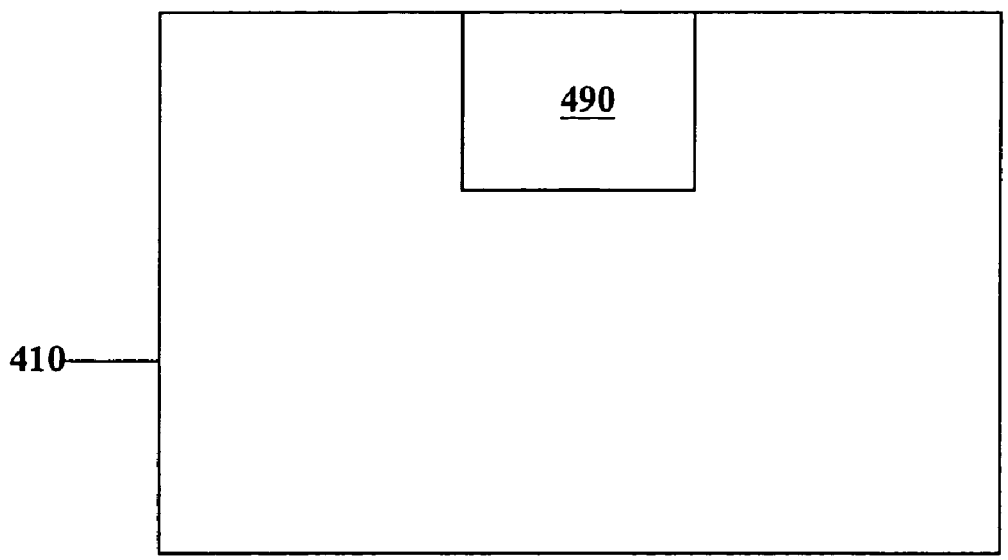
FIGS. 4A-4E show another exemplary method for forming an improved isolation trench according to another embodiment of the invention.
Figure 4B:
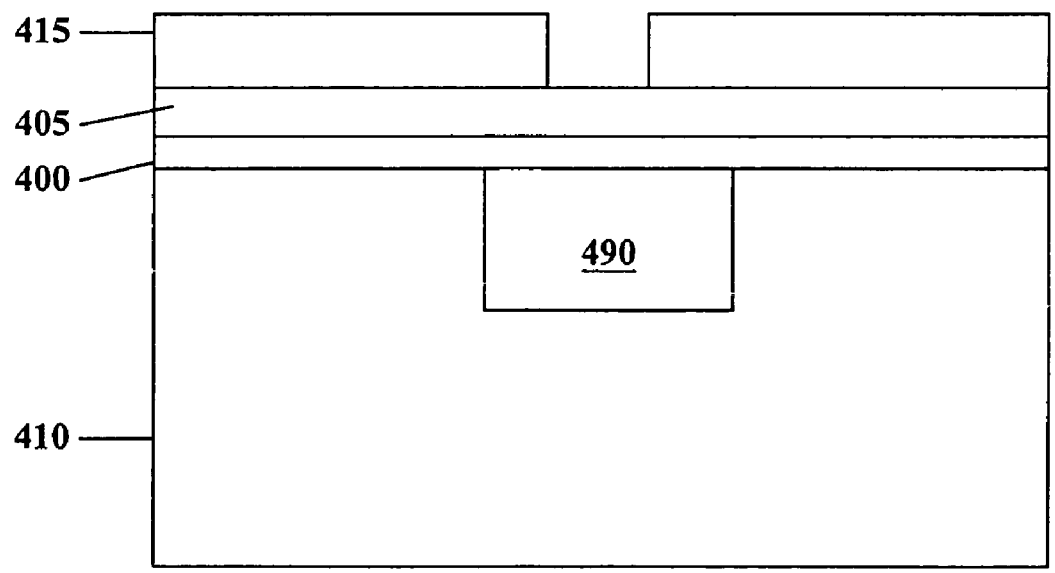

FIG. 4B shows application of pad oxide 400, silicon nitride 405 layers and photo resist layers 415 onto the filled trench of FIG. 4A, followed by patterning of the photo resist 415. Then, FIG. 4C shows formation of trench 420 through the first dielectric material 490 and into the silicon substrate 410, using an anisotropic process, such as a dry etch.

Figure 4C:
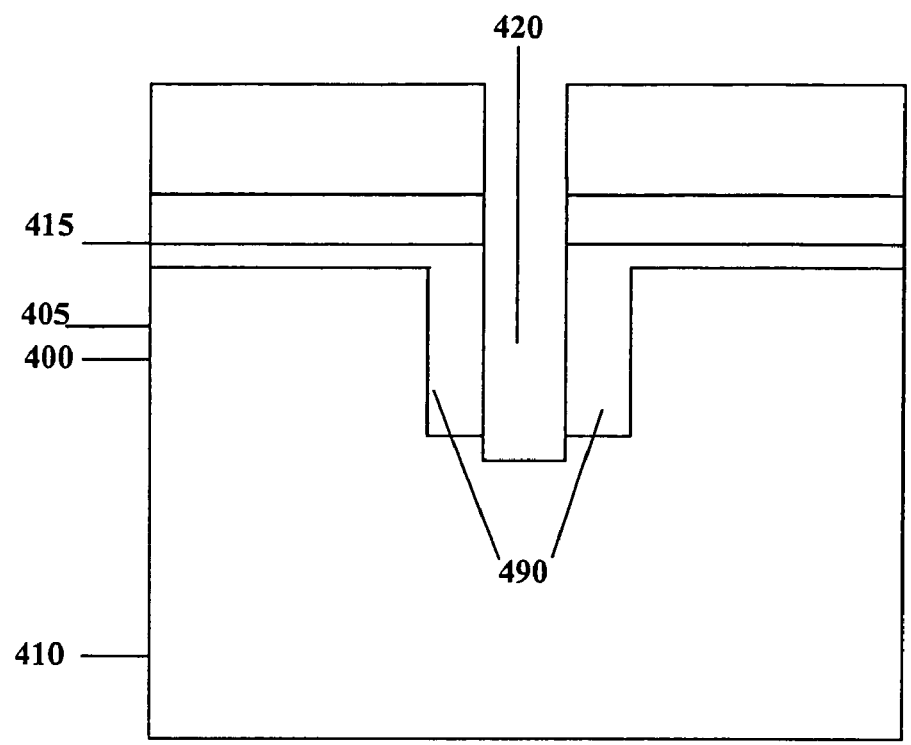
Figure 4D:
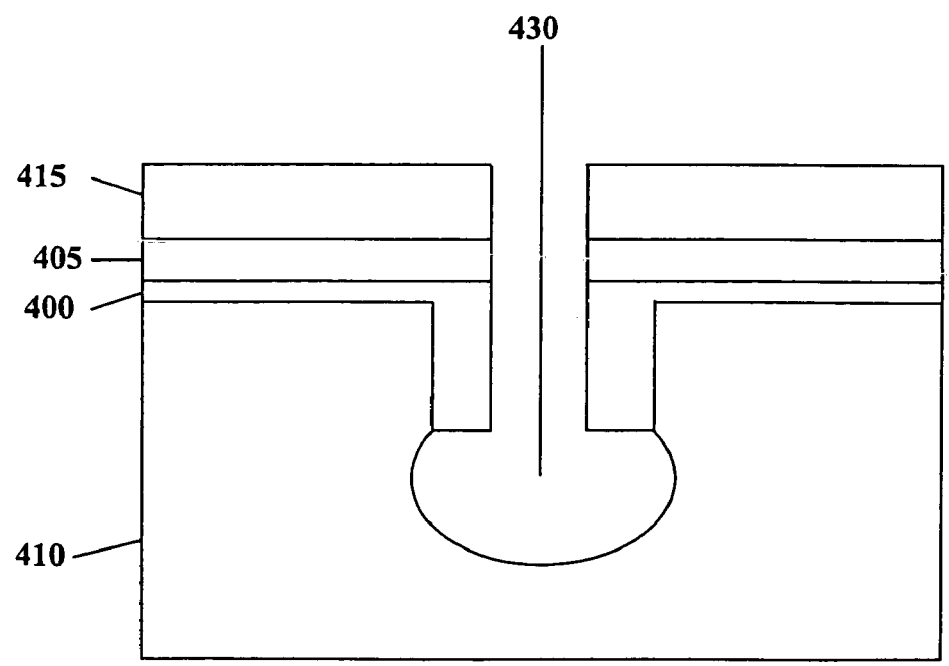
Figure 4E:
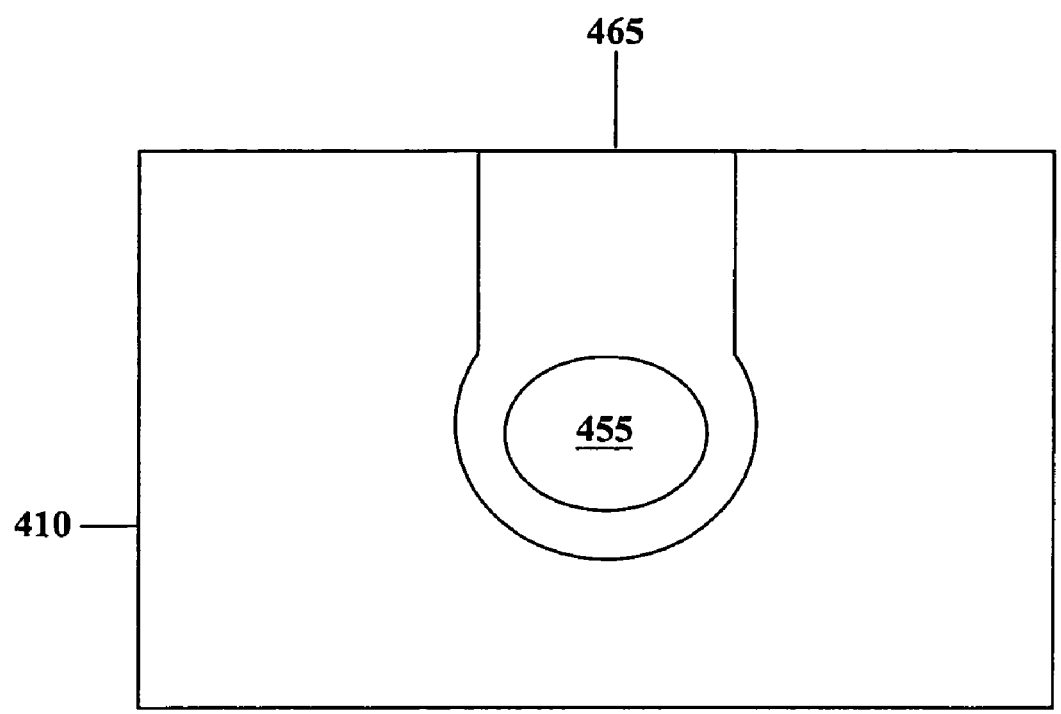

FIG. 4D shows isotropic etching of the trench 420 of FIG. 4C to produce a retrograde trench 430. Subsequent silicon oxide growth by thermal oxidation on the walls of trench 430 results in sealing of the trench, and creating a space 455 within the silicon oxide layer in the trench. FIG. 4E shows the final retrograde trench isolation structure 465 after removal of the masking materials.

FIGS. 5A-5F show another exemplary embodiment. Items in FIGS. 5A-5F that are the same as items in FIGS. 1A-1H are indicated by reference numerals that are increased by 400. These include pad oxide layer 500, silicon nitride layer 505, silicon substrate 510, photo resist 515, trench 520, and retrograde trench 530. A description of these items is not repeated.

Figure 5A:
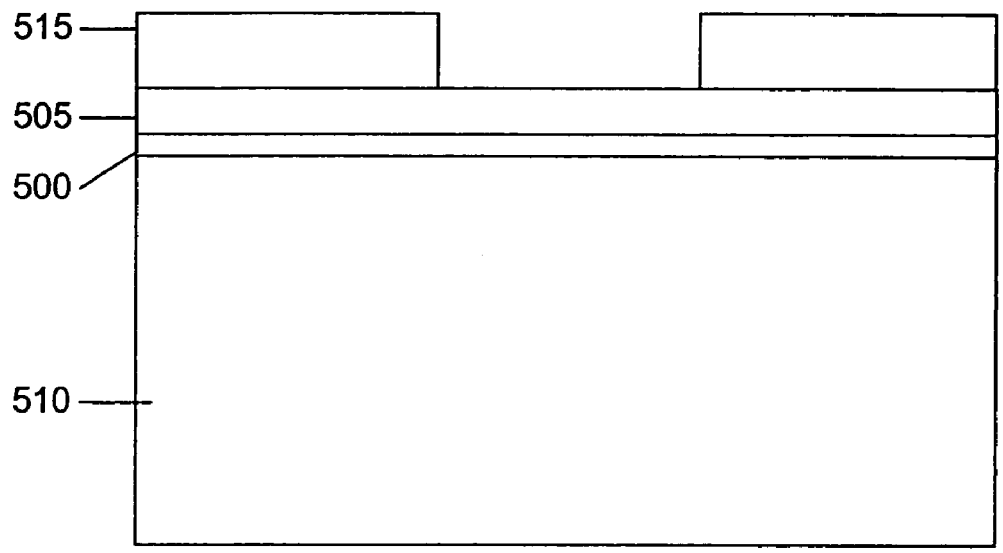
FIGS. 5A-5F show another exemplary method for forming an improved isolation trench according to another embodiment of the invention.
Figure 5B:
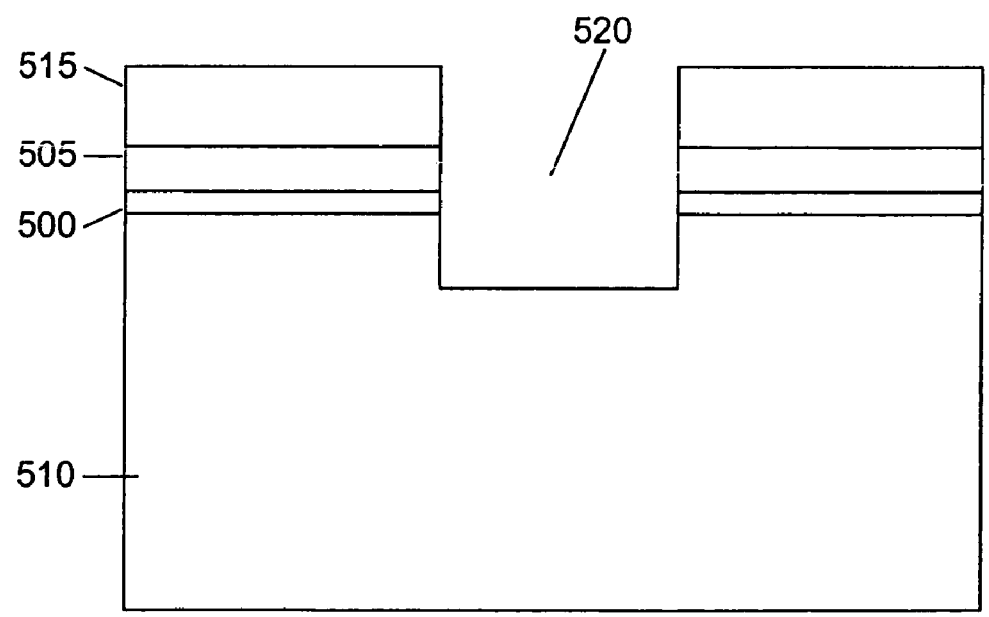

FIG. 5A shows formation of a patterned photomask 515 over substrate 510, oxide layer 500, and SiN layer 505. This can be done by a process as described above with reference to FIG. 1A. FIG. 5B shows formation of a trench 520 through the oxide layer 500 and SiN layer 505, and into the substrate 510. This can be done by a process as described above with reference to FIG. 1B.

Figure 5C:
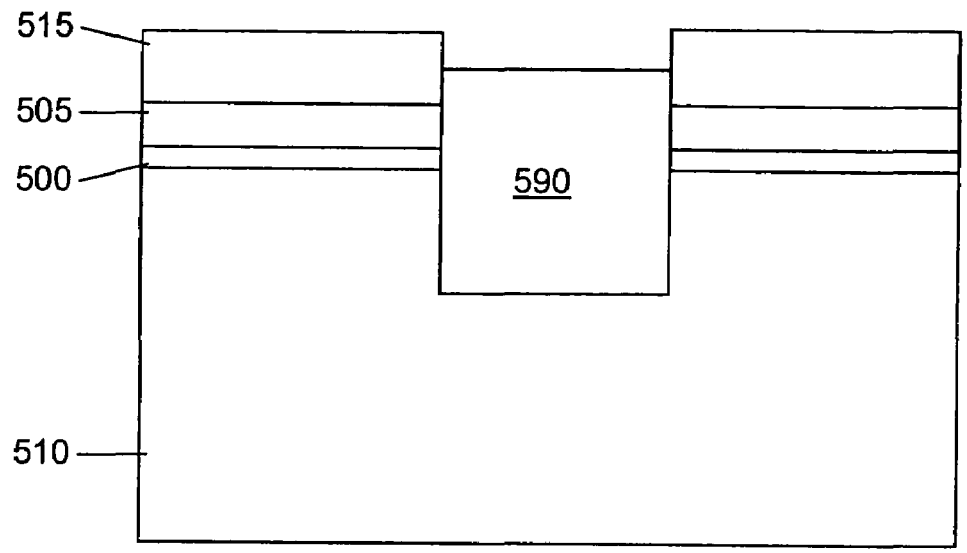

FIG. 5C shows oxide deposition into trench 520 of FIG. 5B, to form an oxide filled trench 590.

Figure 5D:
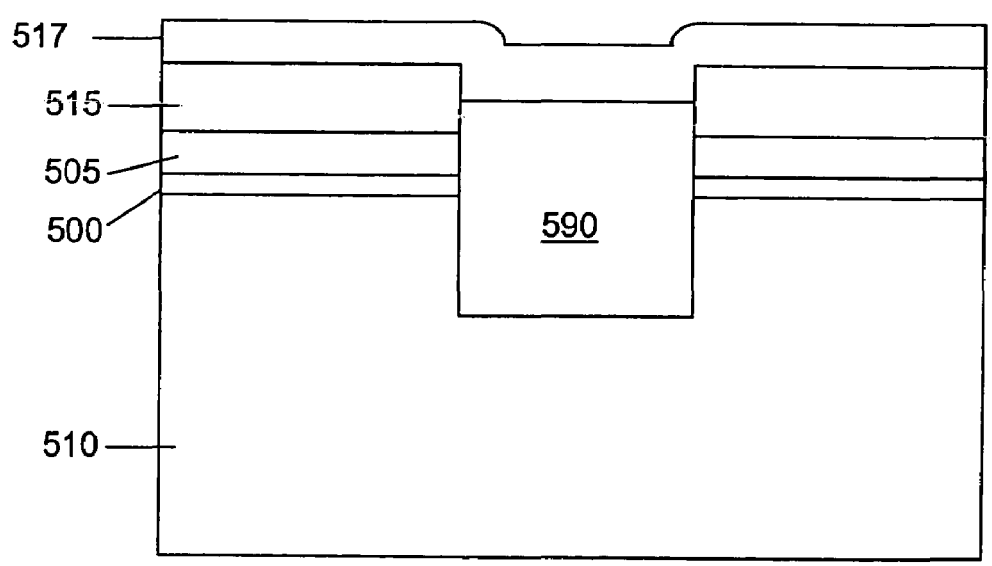

FIG. 5D shows deposition of a mask layer 517, such as silicon nitride or silicon oxynitride, on the surface.

Figure 5E:
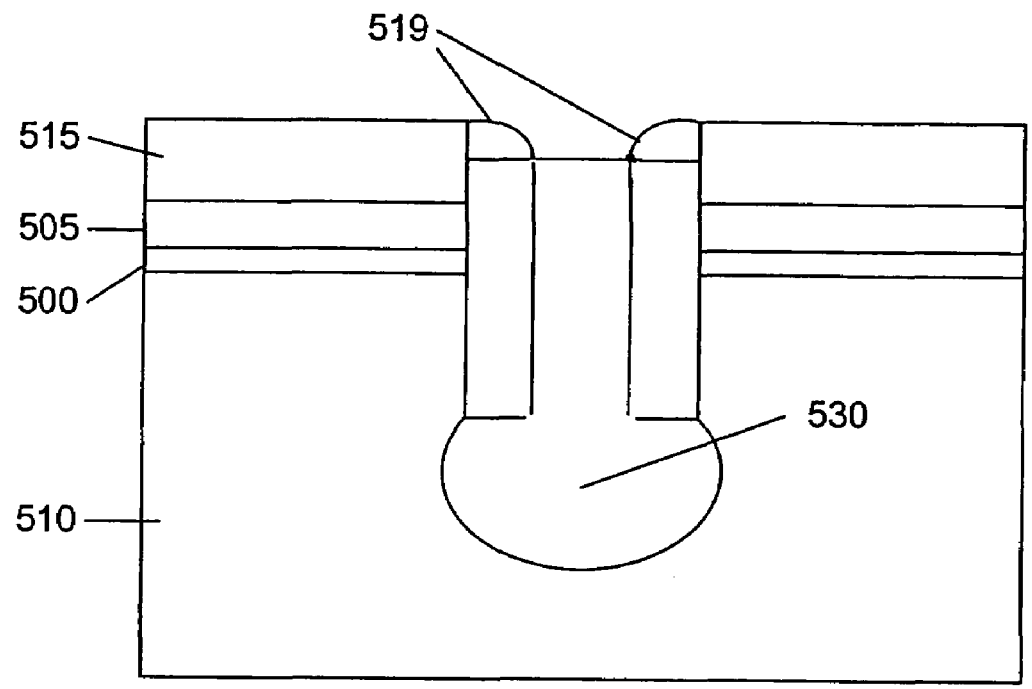

FIG. 5E shows the formation of mask spacers 519 that may be formed by a selective etch back process. Subsequently, a self aligned trench 520 is formed through the oxide filled trench 590 and into the silicon substrate 510. This may be done, for example, by an anisotropic dry etching step. Subsequently, a retrograde trench structure 530 is formed by an isotropic etching process.

Figure 5F:
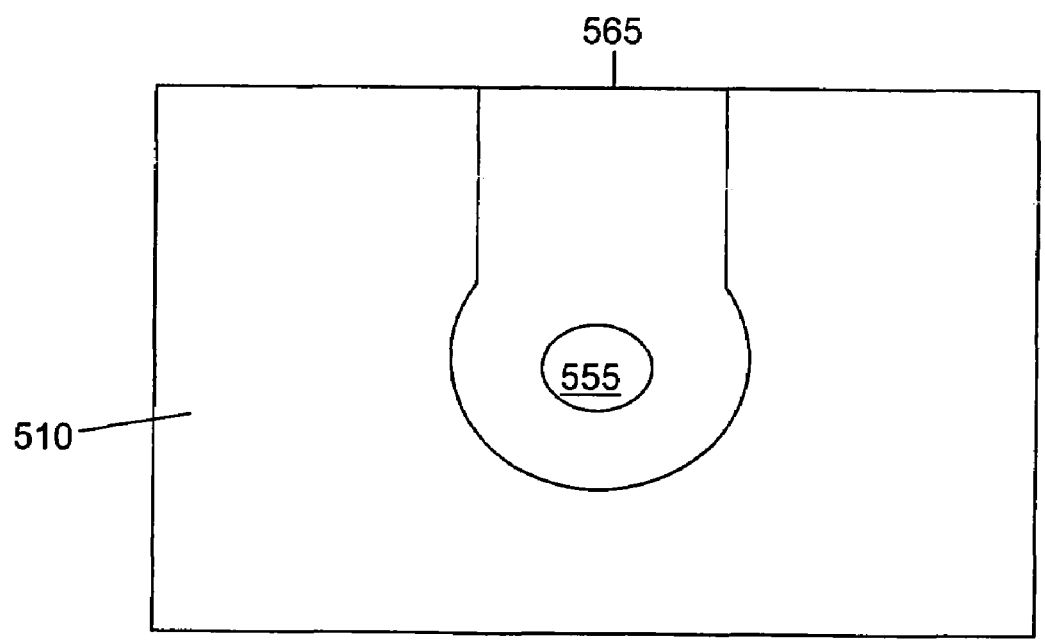

FIG. 5F shows formation of the final retrograde isolation trench structure 565 after silicon oxide growth by thermal oxidation on the walls of the trench resulting in sealing of the trench, and creating a space 555 within the silicon oxide layer in the trench. Subsequently all the spacers, photoresist and masking layers are removed by, for example, using standard methods.

Depending upon the conditions used for forming the silicon oxide layer by thermal oxidation, various gases or even a vacuum can optionally be trapped within the space formed when the trench is sealed. Examples of gasses that may be contained in the space include, but are not limited to, Air, $N_2$, and/or $O_2$. Thus, in any of the embodiments shown in FIG. 1H, 2C, 3G or 4E, the space may contain a vacuum or a gas having a desired dielectric property. The presence of a space containing such materials provides improved isolation between active regions. It is also understood from the drawings that depending upon the geometry of the trench and conditions of the thermal oxidation step, the geometry of the space within the layer of silicon oxide can be controlled.

An STI structure formed by the methods described above provide a space that improves isolation efficiency over a trench that is completely filled with the oxide material.

Although the examples described above include a silicon substrate, the method may also be applied for other types of semiconductor substrates. For example, it will also be understood that other substrates, such as silicon on insulator (SOI) or glass, and substrates that contain ceramic or organic material are also suitable.

Although the invention has been described in terms of exemplary embodiments, it is not limited thereto. Rather, the invention should be construed broadly, to include other variants and embodiments, which may be made by those skilled in the art without departing from the scope and range of equivalents of the appended claims.

What is claimed is:

1. A trench structure, comprising:
   a semiconductor substrate having a trench therein;
   said trench having a first portion, a second portion and walls, the second portion having a larger dimension than the first portion; and
   said trench having a layer of silicon oxide on the walls of said trench, wherein said first portion and said second portion connect to a single opening on a top surface of said semicondactor substrate and said layer of silicon oxide has sealed said single opening of the trench, with at least a space formed beneath said layer of silicon oxide, wherein the space has a substantially oval shape with a long axis in a horizontal direction and a short axis in a vertical direction.

2. The trench of claim 1, wherein said space substantially contains a vacuum.

3. The trench of claim 1, wherein the space contains a gas.

4. The trench of claim 1, wherein the semiconductor substrate is a silicon substrate.

5. The trench of claim 4, wherein the silicon substrate further comprises a rounded top surface adjacent said trench.

6. The trench of claim 1, wherein said second portion comprises a substantially round bottom.

7. The trench of claim 6 further comprising a dielectric material tip disposed on said substantially round bottom.

8. The trench of claim 1, wherein said layer of silicon oxide extends from said first portion into said second portion.

9. The trench of claim 8, wherein said layer of silicon oxide extending from said first portion into said second portion has a notch substantially at a position where said first portion and said second portion meet.

10. The trench of claim 1, wherein said space has a substantially oval shape with a long axis in a horizontal direction and a short axis in a vertical direction.

11. The trench of claim 1, wherein said layer of silicon oxide extends from one side of said single opening along a first sidewall of said first portion, a first sidewall of said second portion, a bottom of said second portion, a second sidewall of said second portion and a second sidewall of said first portion to another side of said single opening.

12. A method of making the isolation structure according to claim 1, comprising the steps of:
   forming the retrograde trench in the silicon substrate, the trench having the first portion, the second portion and walls, the second portion of the trench having a larger dimension than the first portion;
   forming the layer of silicon oxide on the walls of said trench by thermal oxidation; and
   sealing the trench so that at least the space is formed in said second portion.

13. The method of claim 12, wherein a top surface of said layer of silicon oxide formed by thermal oxidation is between the substrate and a mask layer over the substrate.

14. The method of claim 12, wherein the surface of said layer of silicon oxide formed by thermal oxidation is above a surface of the substrate.

15. The method of claim 12, wherein a mask layer above the substrate is removed without planarization.

16. The method of claim 12, wherein oxidation of the silicon substrate under edges of the mask layer occurs during said thermal oxidation process.

17. The method of claim 16, further comprising removal of the mask layer such that the surface of the silicon substrate at edges of the trench are rounded.

18. A method of making the isolation structure according to claim 1, comprising the steps of:
   forming the trench having walls and a bottom in the silicon substrate having oxide and mask layers thereon;
   forming the layer of silicon oxide on the walls and bottom of said trench by thermal oxidation;
   forming a self aligned trench opening in a portion of said silicon oxide layer and into the silicon substrate;
   isotropically etching the silicon substrate to produce a retrograde portion of the trench;
   forming an additional layer of silicon oxide by thermal oxidation; and
   sealing the trench so that at least the space is formed within the additional silicon oxide layer.

19. The method of claim 18, wherein a top surface of said layer of silicon oxide formed by thermal oxidation is above a surface of the substrate.

20. A method of making the isolation structure according to claim 1, comprising the steps of:
   forming a first trench in the silicon substrate having a surface and oxide and mask layers;
   filling said first trench with a first dielectric material, and subsequently removing the oxide and mask layers to produce a substrate with a filled first trench;
   applying a second set of oxide and mask layers to the surface of said substrate and said first filled trench;
   masking a portion of the surface of said second mask layer such that a second trench can be formed in said first filled trench containing said first dielectric material;
   forming the second trench through a portion of said first dielectric material and into the substrate;
   isotropically etching an exposed portion of said silicon substrate to produce a retrograde portion of the second trench;
   forming a layer of silicon oxide by thermal oxidation; and
   sealing the second trench so that at least the space is created therein.

21. The method of claim 20, further comprising the step of filling said sealed second trench with a dielectric material.

22. The method of claim 21, further comprising the step of removing the oxide and mask layers.

23. The method of claim 20, wherein a top surface of said layer of silicon oxide formed by thermal oxidation is above the substrate surface.

24. The method of claim 23, further comprising the step of removing the oxide and mask layers.

25. A method of making the isolation structure according to claim 1, comprising the steps of:
   forming a first trench in the substrate having a surface, oxide and first mask layers;
   filling said first trench with a first dielectric material;
   applying a second mask layer above the trench;
   removing at least a portion of said second mask layer such that spacers are formed over a portion of the surface of said first dielectric material;
   forming a second trench throught the first dielectric material between said spacers;
   etching an exposed portion of the substrate to produce a retrograde portion of the second trench;
   forming a layer of silicon oxide by thermal oxidation; and
   sealing the second trench so that at least the space is created therein.

26. The method of claim 25, further comprising the step of filling said sealed second trench with a dielectric material.

27. The method of claim 25, further comprising the step of removing said spacers, oxide and mask layers.

28. A method of fabricating a semiconductor device having the isolation device according to claim 1, comprising:
- forming a semiconductor device on the substrate of the semiconductor substrate;
- forming a retrograde trench in the silicon substrate proximate to the semiconductor device, the trench having the first portion, the second portion and walls, the second portion of the trench having a larger dimension than the first portion;
- forming the layer of silicon oxide on the walls of said trench by thermal oxidation; and
- sealing the trench so that at least the space is formed in said second portion, thereby forming an isolation device in the semiconductor substrate.

29. The method of claim 28, wherein said semiconductor device is a transistor or capacitor.

* * * * *

UNITED STATES PATENT AND TRADEMARK OFFICE
CERTIFICATE OF CORRECTION

PATENT NO. : 7,339,253 B2
APPLICATION NO. : 10/919546
DATED : March 4, 2008
INVENTOR(S) : Chao-Tzung Tsai, Ling-Sung Wang and Ching Lang Yen It is certified that error appears in the above-identified patent and that said Letters Patent is hereby corrected as shown below:

Column 7, line 13, delete "semicondactor" and insert -- semiconductor -- therefor.

Column 8, line 59, delete "throught" and insert -- through -- therefor.

Column 9, line 6, delete "substrate" and insert -- surface -- therefor.

Signed and Sealed this

Seventeenth Day of June, 2008

JON W. DUDAS
*Director of the United States Patent and Trademark Office*